United States Patent
Chen

(10) Patent No.: US 9,640,644 B1
(45) Date of Patent: May 2, 2017

(54) SEMICONDUCTOR DEVICE

(71) Applicant: Mitsubishi Electric Corporation, Tokyo (JP)

(72) Inventor: Ze Chen, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/120,874

(22) PCT Filed: May 22, 2014

(86) PCT No.: PCT/JP2014/063602
§ 371 (c)(1),
(2) Date: Aug. 23, 2016

(87) PCT Pub. No.: WO2015/177910
PCT Pub. Date: Nov. 26, 2015

(51) Int. Cl.
*H01L 29/66* (2006.01)
*H01L 29/739* (2006.01)
*H01L 29/10* (2006.01)

(52) U.S. Cl.
CPC ...... *H01L 29/7397* (2013.01); *H01L 29/1095* (2013.01)

(58) Field of Classification Search
CPC .............. H01L 29/0696; H01L 29/4236; H01L 29/66348; H01L 29/7397; H01L 29/7813;
(Continued)

(56) References Cited

U.S. PATENT DOCUMENTS 5,541,430 A 7/1996 Terashima
6,303,410 B1 10/2001 Baliga
(Continued)

FOREIGN PATENT DOCUMENTS

JP H05-347414 A 12/1993
JP 2000-228519 A 8/2000
(Continued)

OTHER PUBLICATIONS

Notification of Transmittal of Translation of the International Preliminary Report on Patentability and Translation of Written Opinion of the International Searching Authority; PCT/JP2014/063602 issued on Dec. 1, 2016.
(Continued)

Primary Examiner — Robert Bachner
(74) Attorney, Agent, or Firm — Studebaker & Brackett PC

(57) ABSTRACT

A planar MOSFET is provided on the upper surface of the $N^-$-type semiconductor substrate in a mesa portion between the trenches. A $P^+$-type emitter layer is provided between the trench and the planar MOSFET in the mesa portion. A P-type collector layer is provided on a lower surface of the $N^-$-type semiconductor substrate. The planar MOSFET includes an $N^+$-type emitter layer, an upper portion of the $N^-$-type semiconductor substrate, a P-type base layer, and a planar gate on the foregoing with a gate insulating film interposed therebetween. The planar gate is connected to the gate trench. The $P^+$-type emitter layer has a higher impurity concentration than the P-type base layer and has an electric potential equal to an emitter potential of the $N^+$-type emitter layer. The $N^+$-type emitter layer is not in contact with the trench. A trench MOSFET is not formed.

6 Claims, 15 Drawing Sheets

(58) Field of Classification Search
CPC ............... H01L 29/407; H01L 29/4238; H01L 29/66378; H01L 29/66787; H01L 29/7455; H01L 29/749; H01L 29/7802
See application file for complete search history.

(56) References Cited

U.S. PATENT DOCUMENTS

| | | |
|---|---|---|
| 6,380,586 B1 | 4/2002 | Yoshikawa |
| 2003/0141542 A1 | 7/2003 | Ishimura et al. |

FOREIGN PATENT DOCUMENTS

| | | |
|---|---|---|
| JP | 2003-224278 A | 8/2003 |
| JP | 2008-034467 A | 2/2008 |

OTHER PUBLICATIONS

International Search Report issued in PCT/JP2014/063602; mailed Jul. 22, 2014.
Nakamura et al.; Wide Cell Pitch LPT(II)-CSTBTTM(III) Technology Rating up to 6500 V for Low Loss; Proceedings of The 22nd International Symposium on Power Semiconductor Devices & ICs; 2010; pp. 387-390; Hiroshima, Japan.

SEMICONDUCTOR DEVICE

FIELD

The present invention relates to a semiconductor device including an Insulated Gate Bipolar Transistor (IGBT).

BACKGROUND

In planar IGBTs having planar MOS structures, a planar gate is used. Accordingly, a region necessary for device operation must be ensured, and miniaturization is limited. Moreover, a high ON voltage imposes a limitation. Meanwhile, trench IGBTs have trench (vertical) gate structures, and can therefore be miniaturized (e.g., see Patent Document 1). Further, ON voltage characteristics can be improved by utilizing the electron injection effect at trench bottoms.

CITATION LIST

Patent Literature

Patent Document 1: Japanese Patent Application Publication No. 2000-228519

SUMMARY

Technical Problem

However, trench IGBTs have the problem that short-circuit breaking capacities are low because saturation current densities are high due to high active cell densities. A cell is a minimum pattern repeated in perpendicular and longitudinal directions of trenches. An active cell density is the number of cells within an area of 1 cm$^2$. An active cell density is defined by the following equation:

active cell density=1/(minimum repeated-unit size in the perpendicular direction of trenches*minimum repeated-unit size in the longitudinal direction of trenches)

Moreover, in the case where the number (hereinafter referred to as a thinning ratio) of trenches per cell cannot be increased, a saturation current can be reduced by increasing a width of a P$^+$-type emitter layer in the longitudinal direction of the trenches, but the ON voltage increases. A thinning ratio is the ratio of the number of trenches set to the emitter potential to the total number of trenches within a cell. A thinning ratio is defined by the following equation:

thinning ratio=the number of trenches set to the emitter potential within a cell/the total number of trenches within the cell The present invention has been accomplished to solve the above-described problems, and an object of the present invention is to provide a semiconductor device in which a saturation current can be reduced without adverse effects on an ON voltage.

Solution to Problem

A semiconductor device according to the present invention includes: an N-type semiconductor substrate; a plurality of trenches in an upper surface of the N-type semiconductor substrate; a gate trench in the trench with an insulating film interposed therebetween; a planar MOSFET on the upper surface of the N-type semiconductor substrate in a mesa portion between the trenches; a P-type emitter layer between the trench and the planar MOSFET in the mesa portion; and a P-type collector layer on a lower surface of the N-type semiconductor substrate, wherein the planar MOSFET includes an N-type emitter layer, an N-type diffusion layer connected to the N-type semiconductor substrate, a P-type base layer between the N-type emitter layer and the N-type diffusion layer, and a planar gate on a part of the N- type emitter layer, the N-type diffusion layer and the P-type base layer with a gate insulating film interposed therebetween, the planar gate is connected to the gate trench, the P-type emitter layer has a higher impurity concentration than the P-type base layer and has an electric potential equal to an emitter potential of the N-type emitter layer, the N-type emitter layer is not in contact with the trench, and a trench MOSFET is not formed.

Advantageous Effects of Invention

In the present invention, the P-type emitter layer having a high impurity concentration is provided between the trench and the planar MOSFET, and the N-type emitter layer is not in contact with the trench. Accordingly, there is no path in which an electronic current flows along sides of the trenches. Therefore, a resistance component of the path does not exist, and therefore an ON voltage is not adversely affected. Further, by lowering the active cell density by increasing the channel length of the planar MOSFET without increasing the length of the P-type emitter layer, a saturation current can be reduced without adverse effects on the ON voltage.

DESCRIPTION OF EMBODIMENTS

A semiconductor device according to the embodiments of the present invention will be described with reference to the drawings. The same components will be denoted by the same symbols, and the repeated description thereof may be omitted.

[Embodiment 1]

Figure 1:
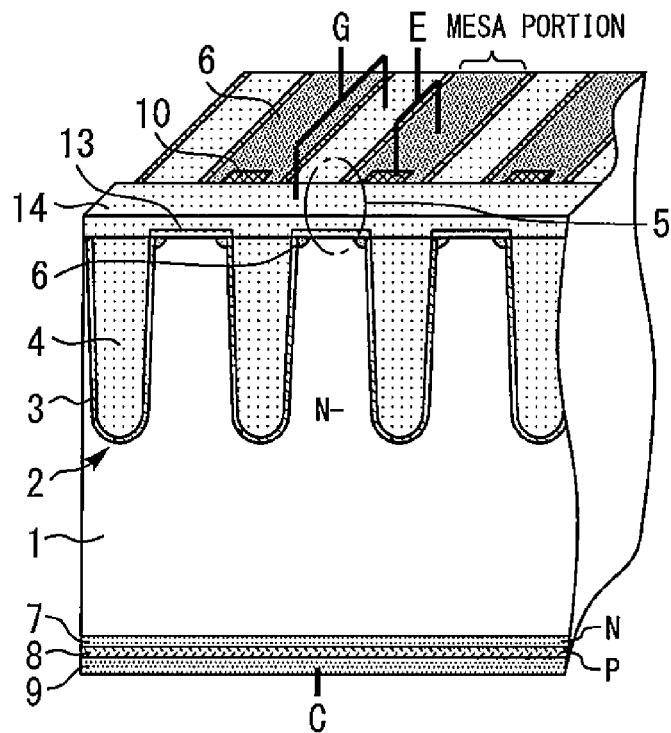
FIG. 1 is a perspective cross-sectional view showing a semiconductor device according to Embodiment 1 of the present invention.
Figure 2:
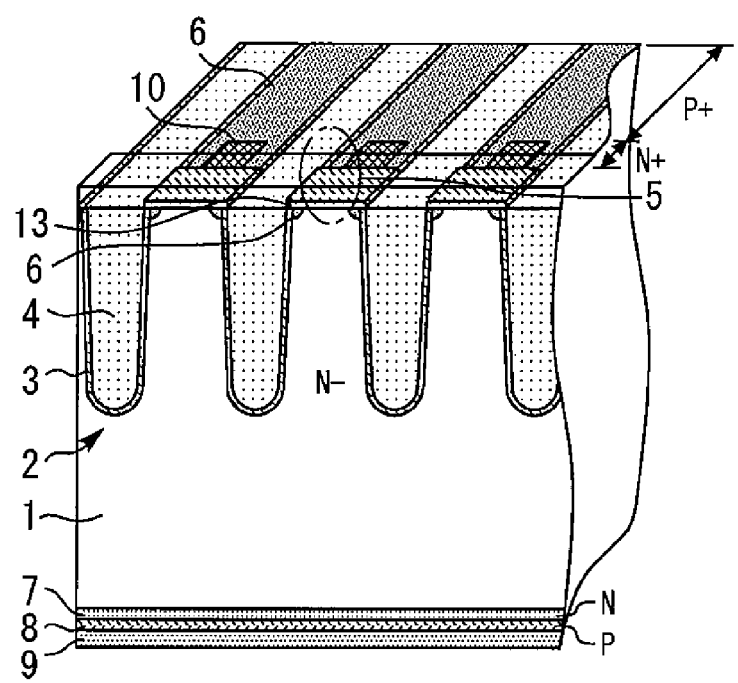
FIG. 2 is a perspective cross-sectional view in which a planar gate of the device in FIG. 1 is omitted.
Figure 3:
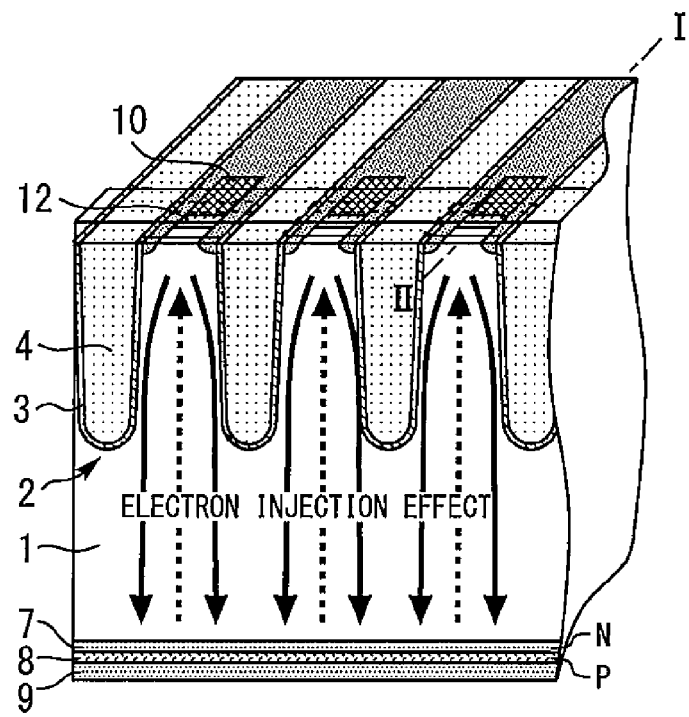
FIG. 3 is a perspective cross-sectional view in which the planar gate and a gate insulating film of the device in FIG. 1 are omitted.
Figure 4:
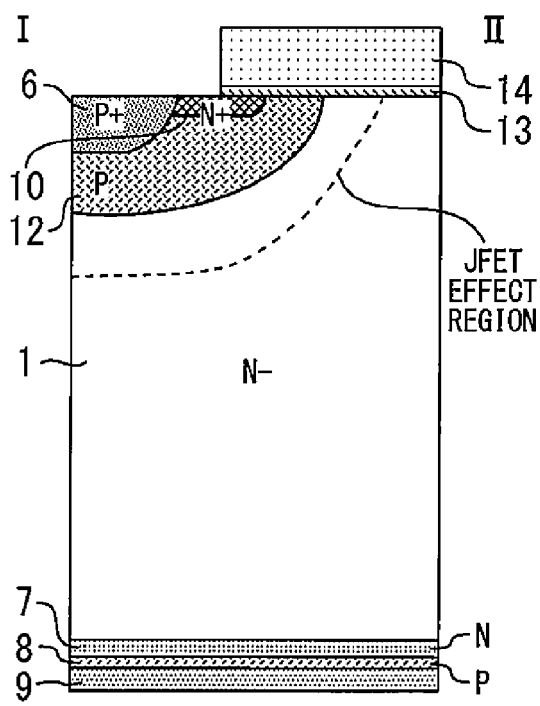
FIG. 4 is a cross-sectional view taken along I-II of FIG. 3.

FIG. 1 is a perspective cross-sectional view showing a semiconductor device according to Embodiment 1 of the present invention. FIG. 2 is a perspective cross-sectional view in which a planar gate of the device in FIG. 1 is omitted. FIG. 3 is a perspective cross-sectional view in which the planar gate and a gate insulating film of the device in FIG. 1 are omitted. FIG. 4 is a cross-sectional view taken along I-II of FIG. 3. It should be noted that though an example of a high breakdown voltage class of 6500 V is described as an embodiment, the present invention can be applied to any breakdown voltage class.

A plurality of trenches 2 are provided in an upper surface of an N$^-$-type semiconductor substrate 1. A gate trench 4 is provided in the trench 2 with an insulating film 3 interposed therebetween. There is a planar MOSFET (Metal-Oxide-Semiconductor Field-Effect Transistor) 5 on the upper surface of the N$^-$-type semiconductor substrate 1 in a mesa portion between the trenches 2. A P$^+$-type emitter layer 6 is provided between the trench 2 and the planar MOSFET 5 in the mesa portion. An N-type buffer layer 7 and a P-type collector layer 8 are provided in order on a lower surface of the N$^-$-type semiconductor substrate 1. A collector electrode 9 is connected to the P-type collector layer 8.

The planar MOSFET 5 includes an N$^+$-type emitter layer 10, an upper portion of the N$^-$-type semiconductor substrate 1, a P-type base layer 12 provided between the N$^+$-type emitter layer 10 and the upper portion of the N$^-$-type semiconductor substrate 1, and a planar gate 14 provided on the foregoing with a gate insulating film 13 interposed therebetween. The N$^+$-type emitter layer 10 serves as a source, the upper portion of the N$^-$-type semiconductor substrate 1 serves as a drain, and the P-type base layer 12 serves as a channel. Thus, the planar MOSFET 5 operates as an n-channel MOSFET. The gate trench 4 and the planar gate 14 are polysilicon, and the insulating film 3 and the gate insulating film 13 are oxide films.

The planar gate 14 is connected to the gate trench 4. The P$^+$-type emitter layer 6 is provided between the trench 2 and the N$^+$-type emitter layer 10. The P$^+$-type emitter layer 6 has a higher impurity concentration than the P-type base layer 12, and has an electric potential equal to an emitter potential of the N$^+$-type emitter layer 10. The N$^+$-type emitter layer 10 is not in contact with the trench 2, and a trench MOSFET is not formed.

Figure 5:
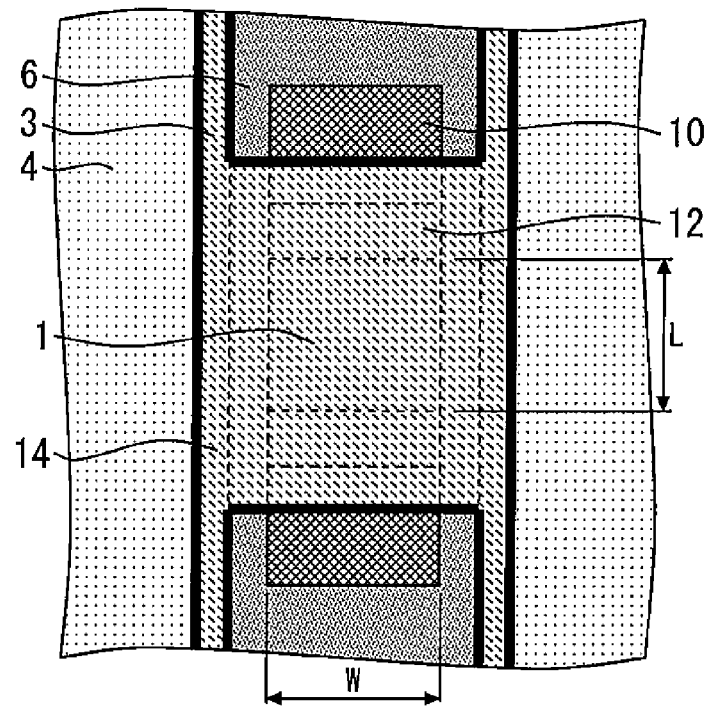
FIG. 5 is a plan view showing the planar MOSFET according to Embodiment 1 of the present invention.

FIG. 5 is a plan view showing the planar MOSFET according to Embodiment 1 of the present invention. It should be noted that the gate insulating film 13 and the planar gate 14 are omitted. The N$^+$-type emitter layer 10, the P-type base layer 12, and the upper portion of the N$^-$-type semiconductor substrate 1 are arranged in order in the longitudinal direction of the trenches 2 in planar view perpendicular to the upper surface of the N$^-$-type semiconductor substrate 1.

A width of the P-type base layer 12 in the lateral direction of the trenches 2 in planar view is a channel width W. A length of the P-type base layer 12 in the longitudinal direction of the trenches 2 in planar view is a channel length L. The active cell density in the longitudinal direction of the trenches 2 can be adjusted by adjusting the length L.

Figure 6:
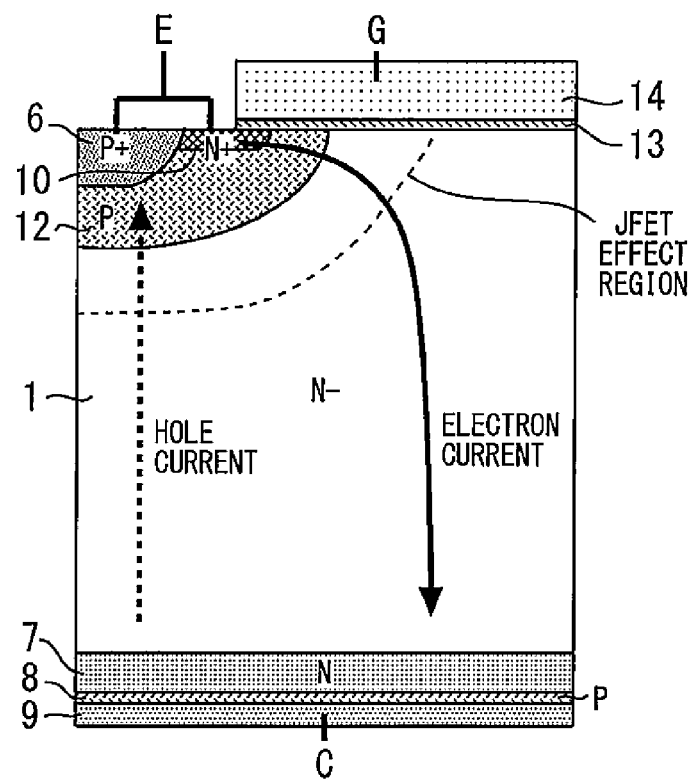
FIG. 6 is a cross-sectional view showing a planar IGBT according to Comparative Example 1.
Figure 7:
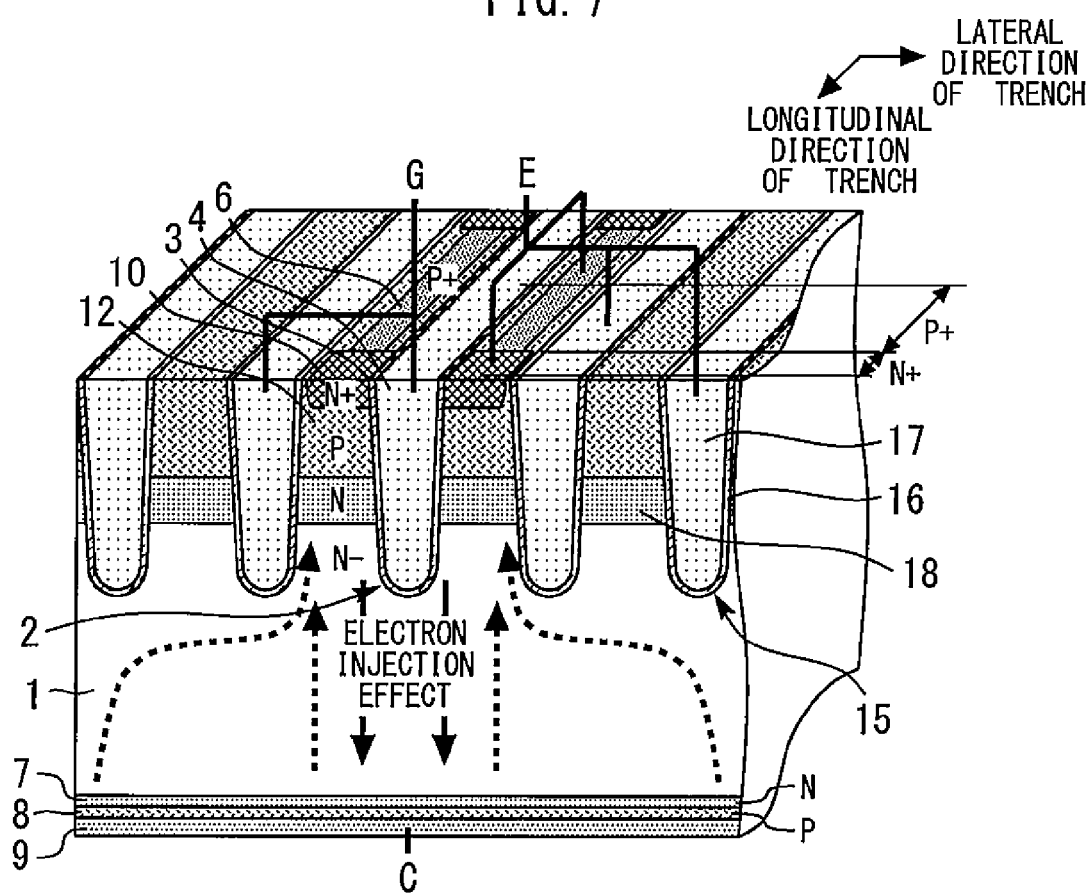
FIG. 7 is a perspective cross-sectional view showing a trench IGBT according to Comparative Example 2.

Next, effects of the present embodiment will be described while comparisons with Comparative Examples 1 and 2 are made. FIG. 6 is a cross-sectional view showing a planar IGBT according to Comparative Example 1. FIG. 7 is a perspective cross-sectional view showing a trench IGBT according to Comparative Example 2. In Comparative Example 2, a plurality of dummy trenches 15 are provided in the upper surface of the N$^-$-type semiconductor substrate 1. A dummy gate trench 17 is provided in the dummy trench 15 with an insulating film 16 interposed therebetween. The dummy gate trench 17 has an electric potential equal to the emitter potential of the N$^+$-type emitter layer 10. Moreover, an N-type diffusion region 18 is provided between the N$^-$-type semiconductor substrate 1 and the P-type base layer 12.

In a withstanding mode ($V_{ge}$=0 V, $V_{ce}$=$V_{cc}$), the gate trenches 4 and the dummy trenches 15 act as field plates. Accordingly, Comparative Example 2 achieves a higher breakdown voltage than that of Comparative Example 1 under conditions where the thickness and resistivity of the N$^-$-type semiconductor substrate 1 are the same.

Figure 8:
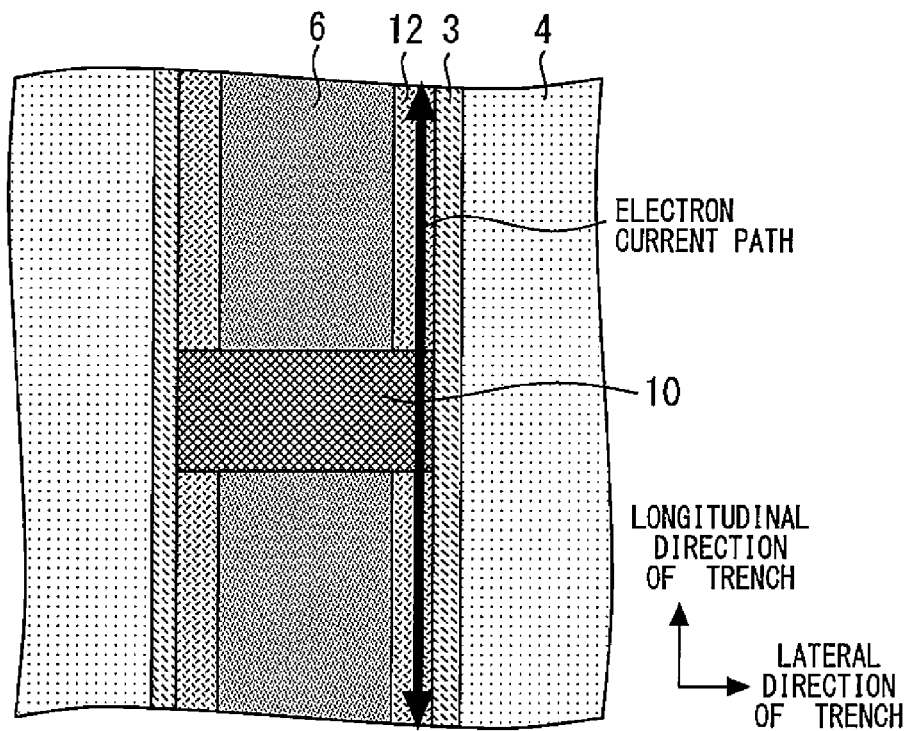
FIG. 8 is a plan view for explaining the flow of an electronic current in Comparative Example 2.
Figure 9:
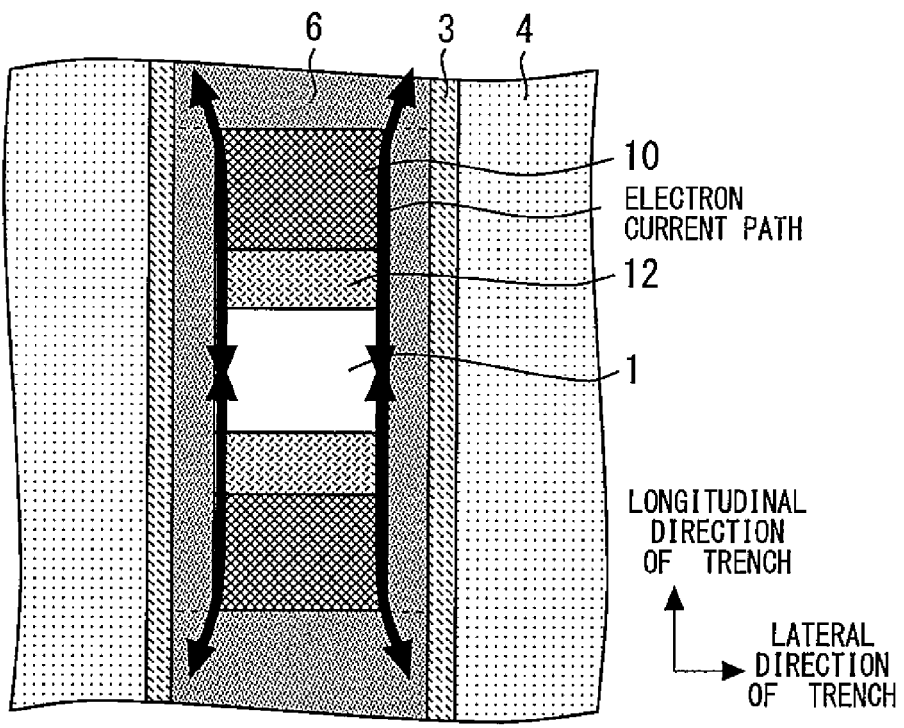
FIG. 9 is a plan view for explaining the flow of an electronic current in the semiconductor device according to Embodiment 1 of the present invention.

FIG. 8 is a plan view for explaining the flow of an electronic current in Comparative Example 2. FIG. 9 is a plan view for explaining the flow of an electronic current in the semiconductor device according to Embodiment 1 of the present invention. Paths of electronic currents are indicated by arrows.

In the case of Comparative Example 2, the length of the P$^+$-type emitter layer 6 is increased to lower the active cell density and increase a resistance component, thus reducing a saturation current density Jc(sat). However, a path in which an electronic current flows along sides of the trenches 2 has a resistance component, and an ON voltage is adversely affected.

Meanwhile, in the present embodiment, the P$^+$-type emitter layer 6 having a high impurity concentration is provided between the trench 2 and the planar MOSFET 5, and the N$^+$-type emitter layer 10 is not in contact with the trench 2. Accordingly, there is no path in which an electronic current flows along sides of the trenches 2. Accordingly, an electronic current flows directly under a channel of the planar MOSFET 5 and the P$^+$-type emitter layer 6. As a result, a resistance component such as in a trench IGBT does not exist, and therefore an ON voltage is not adversely affected. Further, by lowering the active cell density by increasing the channel length L of the planar MOSFET 5 without increasing the length of the P$^+$-type emitter layer 6, a saturation current can be reduced without adverse effects on the ON voltage.

Figure 10:
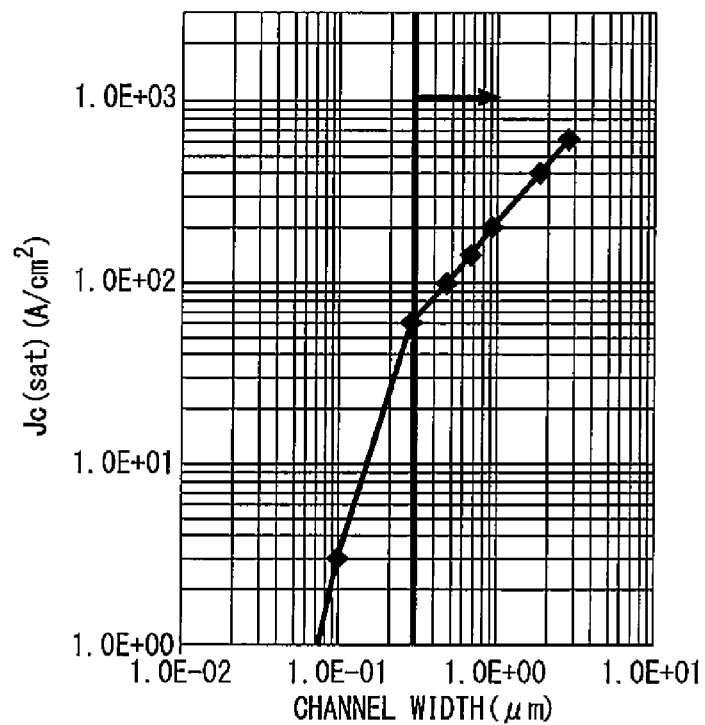
FIG. 10 is a view showing the channel width dependence of the saturation current density Jc(sat).
Figure 11:
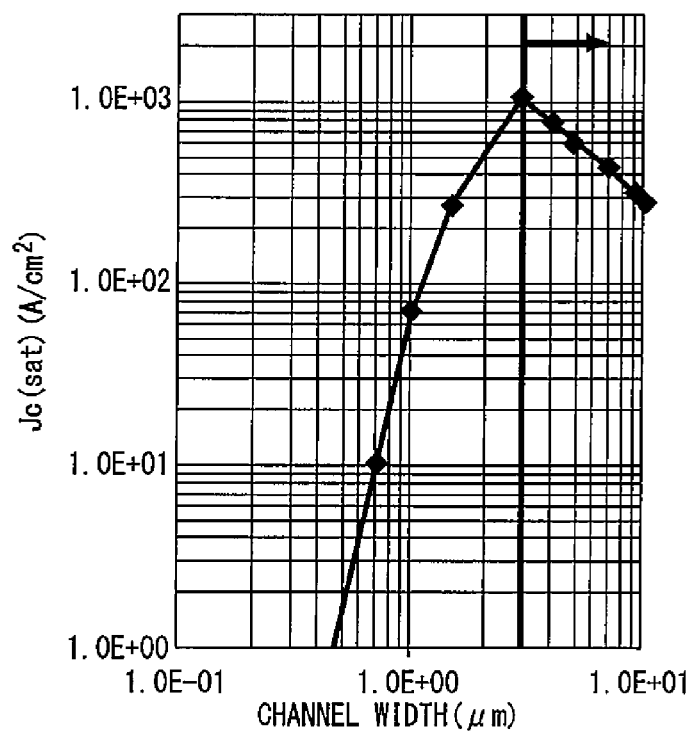
FIG. 11 is a view showing the channel length dependence of the saturation current density Jc(sat).

FIG. 10 is a view showing the channel width dependence of the saturation current density Jc(sat). FIG. 11 is a view showing the channel length dependence of the saturation current density Jc(sat). Evaluation conditions are $V_{GE}$=13.5 V, $V_{CE}$=20 V, and $T_j$=25° C. In FIG. 10, the channel length is 4 μm. In FIG. 11, the channel width is 2 μm. In the case where the gate voltage is constant, Jc(sat) is a characteristic which indicates the current driving force of the device per unit area. From FIGS. 10 and 11, it can be seen that Jc(sat) drastically decreases when the channel width is smaller than 0.3 μm and that Jc(sat) drastically decreases when the channel spacing is smaller than 3.0 μm. Accordingly, it is preferable that the channel width W is not less than 0.3 μm and that the channel length L is not less than 3.0 μm.

Figure 12:
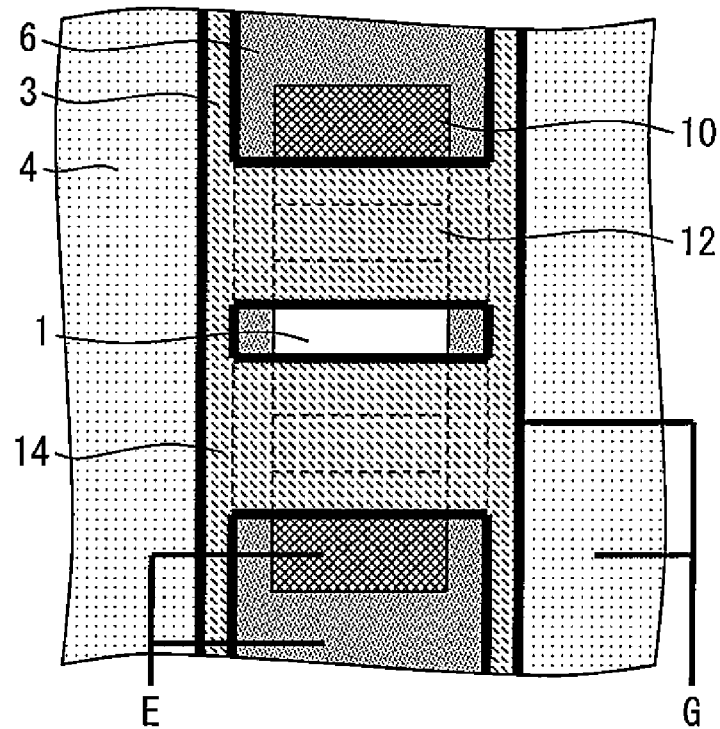
FIG. 12 is a plan view showing a modified example of the planar MOSFET according to Embodiment 1 of the present invention.

FIG. 12 is a plan view showing a modified example of the planar MOSFET according to Embodiment 1 of the present invention. The planar gate 14 of the planar MOSFET 5 is divided. In this case, again, the same effects as those of the above-described embodiment can be obtained.

Figure 13:
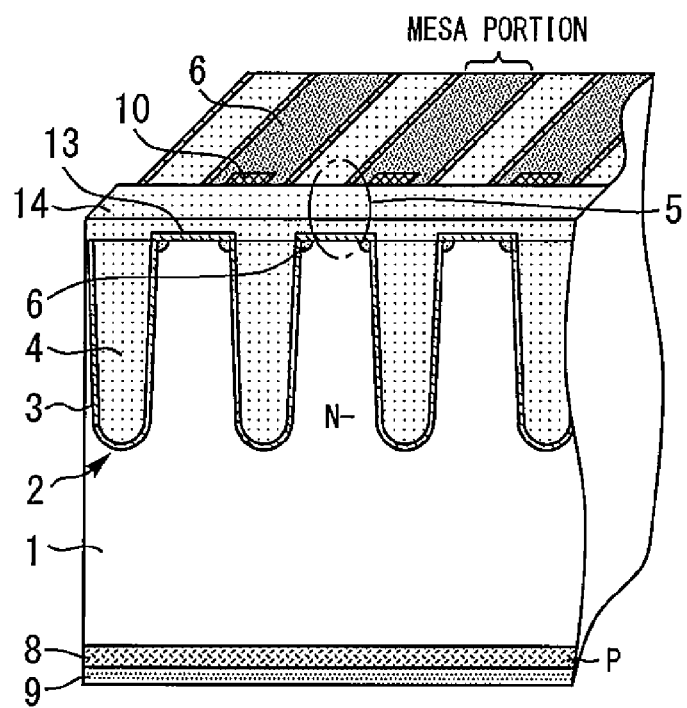
FIG. 13 is a perspective cross-sectional view showing a modified example of the semiconductor device according to Embodiment 1 of the present invention.

FIG. 13 is a perspective cross-sectional view showing a modified example of the semiconductor device according to Embodiment 1 of the present invention. There is no N-type buffer layer 7 on the lower surface of the N$^-$-type semiconductor substrate 1. In this case, again, the same effects as those of the above-described embodiment can be obtained.

Moreover, the trench 2 shown in the above-described embodiment has a round-bottomed shape. It should be noted, however, that the present invention is not limited to this. For example, even when the trenches 2 having other shape such as a rectangular bottom or an expanded bottom is used, the same effects as those of the above-described embodiment can be obtained.

[Embodiment 2]

Figure 14:
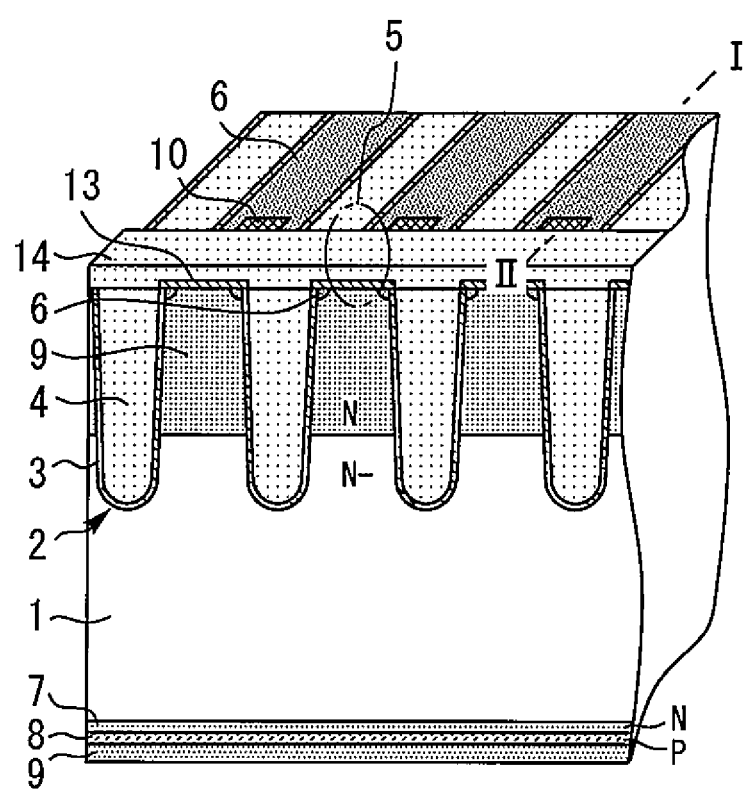
FIG. 14 is a perspective cross-sectional view showing a semiconductor device according to Embodiment 2 of the present invention.
Figure 15:
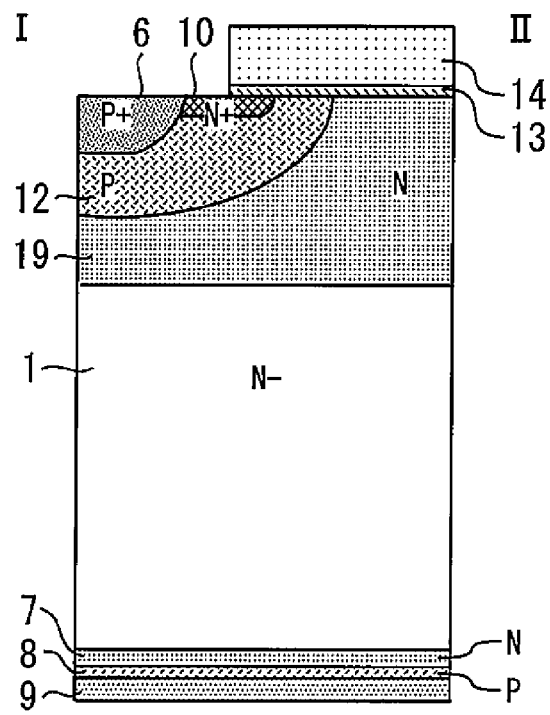
FIG. 15 is a cross-sectional view taken along I-II of FIG. 14.

FIG. 14 is a perspective cross-sectional view showing a semiconductor device according to Embodiment 2 of the present invention. FIG. 15 is a cross-sectional view taken along I-II of FIG. 14. An N-type diffusion layer 19 serving as the drain of the planar MOSFET 5 is provided throughout the entire cell region. The N-type diffusion layer 19 is connected to the N$^-$-type semiconductor substrate 1, has a higher impurity concentration than the N$^-$-type semiconductor substrate 1, and is at a shallower depth than the trenches 2. The N-type diffusion layer 19 serves as a barrier layer against holes, and the carrier concentration on the emitter side of the device increases. Accordingly, the ON voltage can be reduced. Other components and effects are the same as those of Embodiment 1.

[Embodiment 3]

Figure 16:
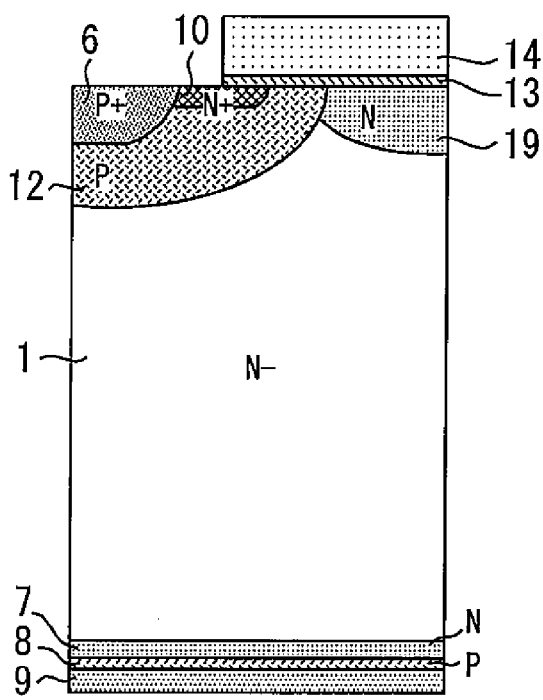
FIG. 16 is a cross-sectional view showing a semiconductor device according to Embodiment 3 of the present invention.

FIG. 16 is a cross-sectional view showing a semiconductor device according to Embodiment 3 of the present invention. The N-type diffusion layer 19 is provided under part of the planar gate 14. Other components are the same as those of Embodiment 2. In this case, again, the same effects as those of Embodiment 2 can be obtained.

Figure 17:
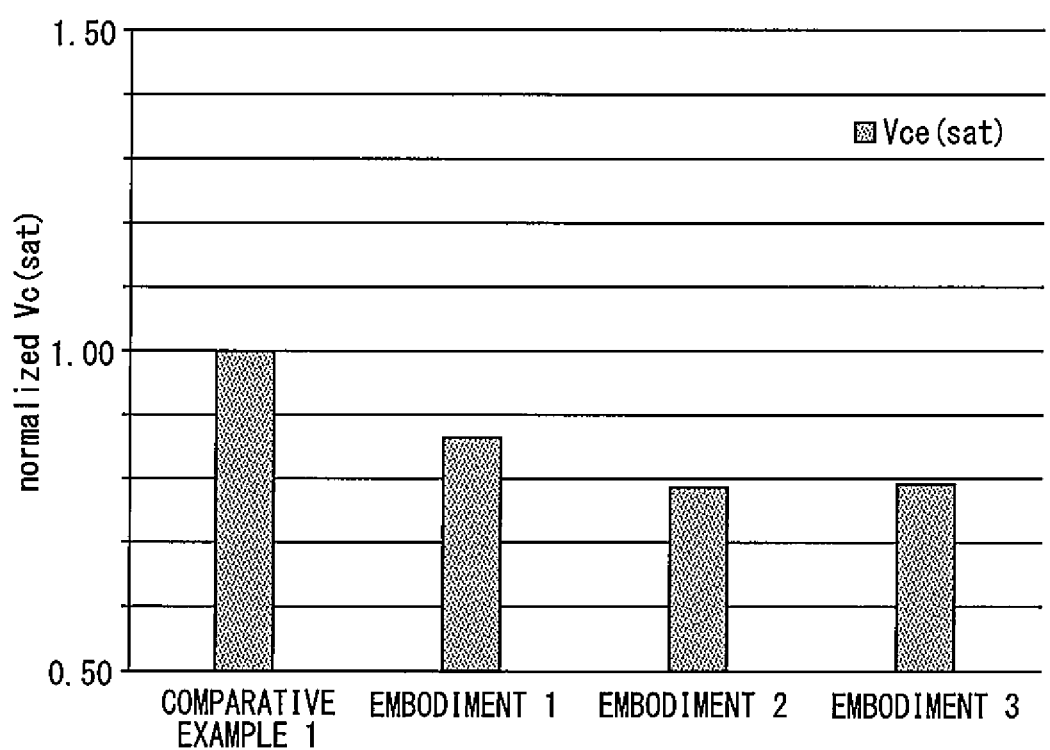
FIG. 17 is a view showing ON voltages of the semiconductor devices according to Comparative Example 1 and Embodiments 1 to 3.

FIG. 17 is a view showing ON voltages of the semiconductor devices according to Comparative Example 1 and Embodiments 1 to 3. Evaluation conditions are $V_{GE}$=15 V, $J_c$=rated current density, and $T_j$=25° C. It can be seen that in Embodiments 2 and 3, the ON voltage further decreases compared to that of Embodiment 1.

[Embodiment 4]

Figure 18:
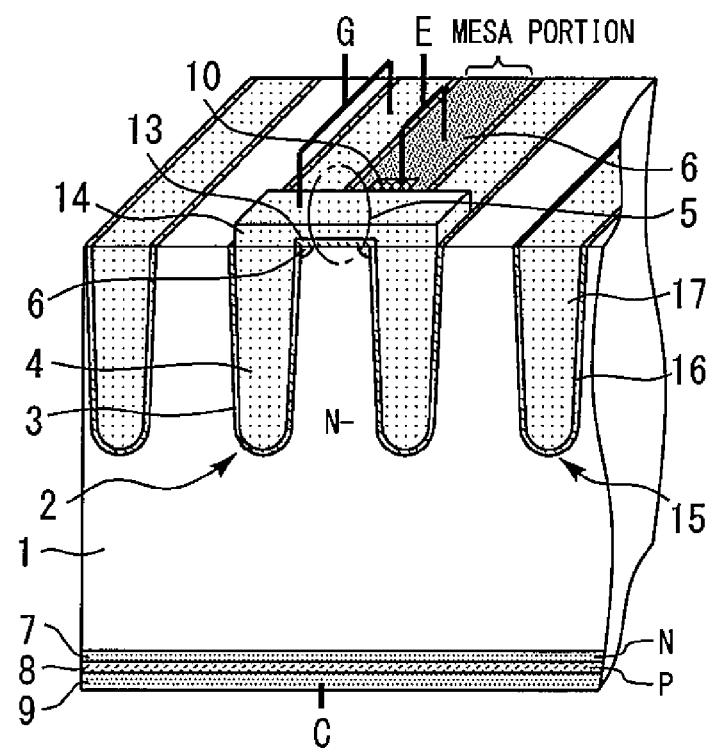
FIG. 18 is a perspective cross-sectional view showing a semiconductor device according to Embodiment 4 of the present invention.
Figure 19:
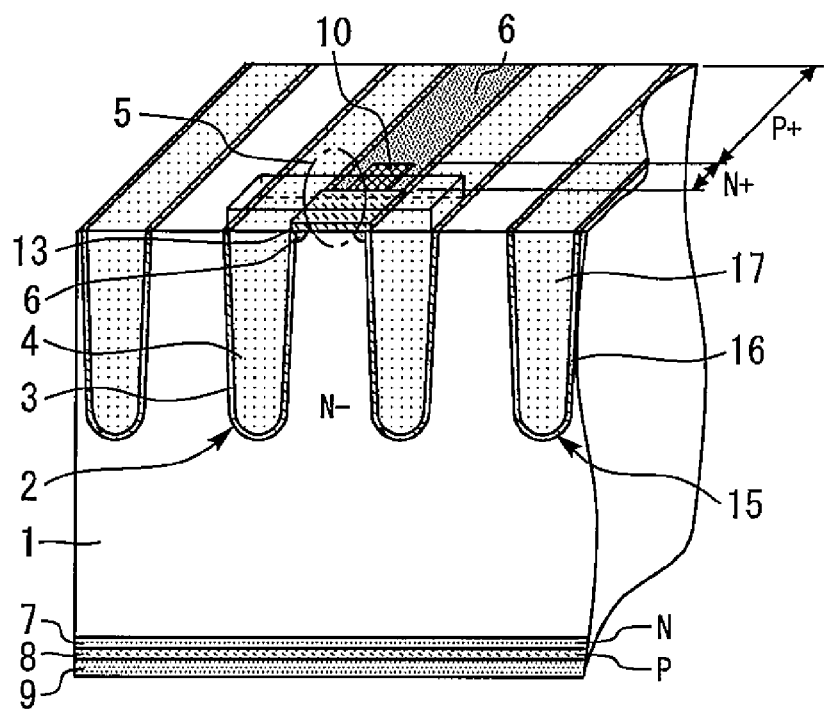
FIG. 19 is a perspective cross-sectional view in which a planar gate of the device in FIG. 18 is omitted.
Figure 20:
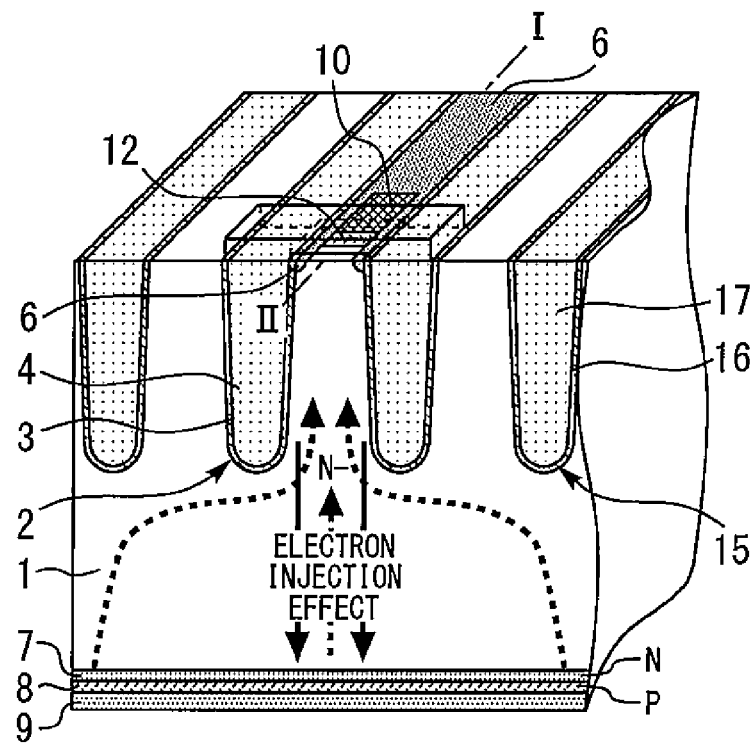
FIG. 20 is a perspective cross-sectional view in which the planar gate and a gate insulating film of the device in FIG. 18 are omitted.
Figure 21:
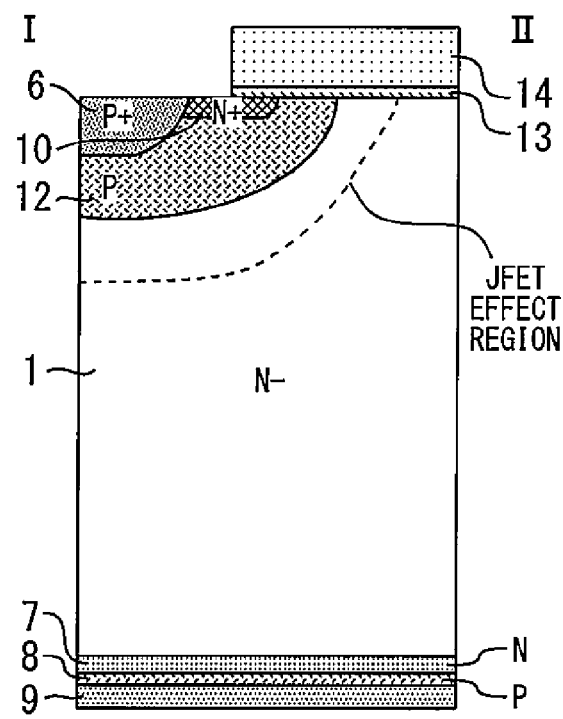
FIG. 21 is a cross-sectional view taken along I-II of FIG. 20.

FIG. 18 is a perspective cross-sectional view showing a semiconductor device according to Embodiment 4 of the present invention. FIG. 19 is a perspective cross-sectional view in which a planar gate of the device in FIG. 18 is omitted. FIG. 20 is a perspective cross-sectional view in which the planar gate and a gate insulating film of the device in FIG. 18 are omitted. FIG. 21 is a cross-sectional view taken along I-II of FIG. 20.

A plurality of dummy trenches 15 are provided in an upper surface of the N$^-$-type semiconductor substrate 1. A dummy gate trench 17 is provided in the dummy trench 15 with an insulating film 16 interposed therebetween. The dummy gate trench 17 has an electric potential equal to an emitter potential of the N$^+$-type emitter layer 10. The dummy gate trench 17 is polysilicon, and the insulating film 16 is an oxide film.

There is a planar MOSFET 5 on the upper surface of the N$^-$-type semiconductor substrate 1 in a mesa portion between the trenches 2, but there is no planar MOSFET 5 between the dummy trenches. This increases the thinning ratio in the lateral direction of the trenches 2 in planar view and decreases the active cell density. Thus, Jc(sat) can be reduced. Other components and effects are the same as those of Embodiment 1.

Figure 22:
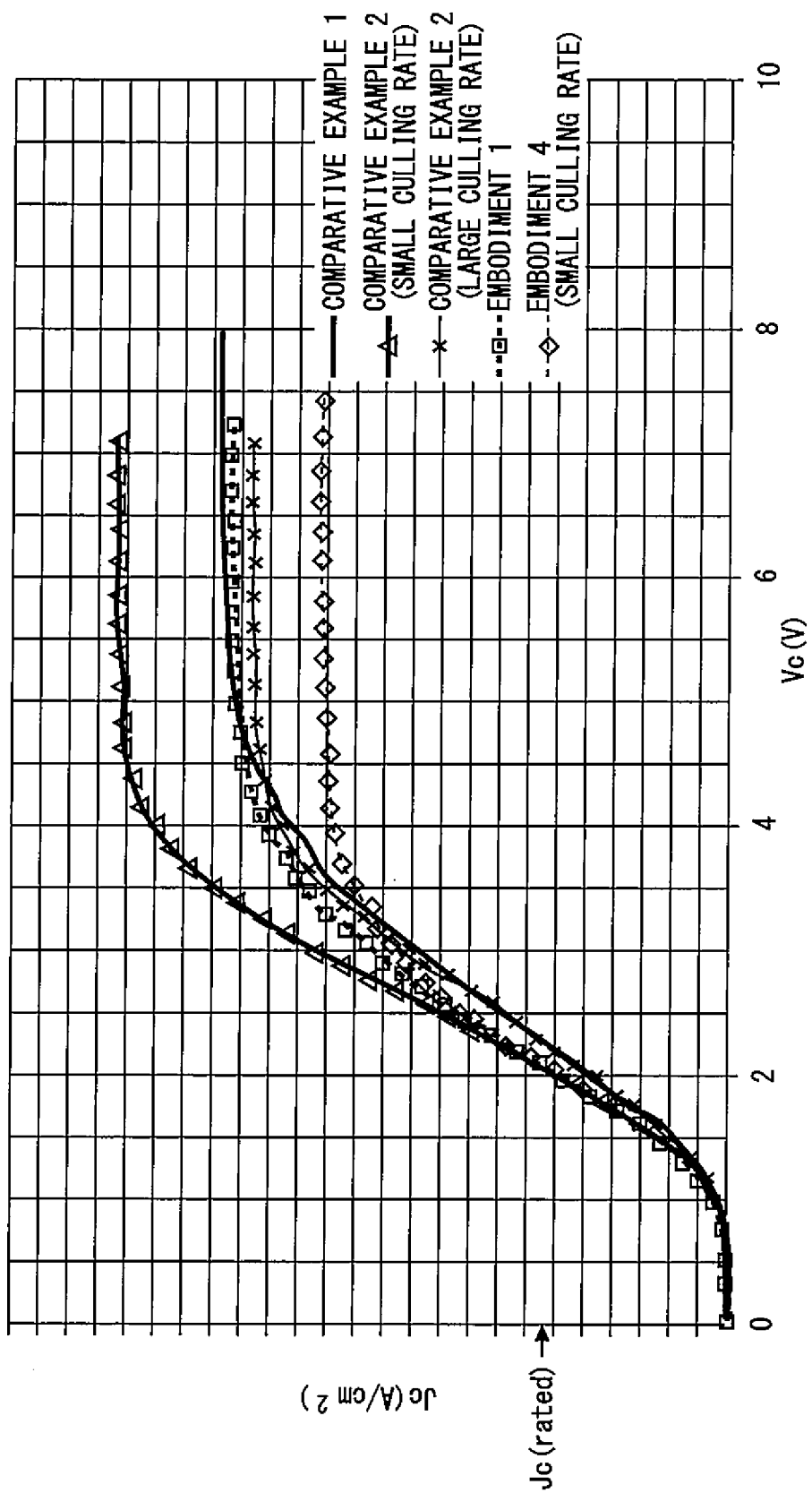
FIG. 22 is a view showing $J_c$-$V_c$ output characteristic waveforms of the devices of Comparative Examples 1 and 2 and Embodiments 1 and 4 which have the same channel length.

FIG. 22 is a view showing $J_c$-$V_c$ output characteristic waveforms of the devices of Comparative Examples 1 and 2 and Embodiments 1 and 4 which have the same channel length. Evaluation conditions are $V_{GE}$=13.5 V and $T_j$=25° C. The thinning ratio of Embodiment 4 was set to the same value as a small thinning ratio of Comparative Example 2. It can be seen that in Embodiments 1 and 4, the saturation current Jc can be reduced without adverse effects on the ON voltage Vc.

Figure 23:
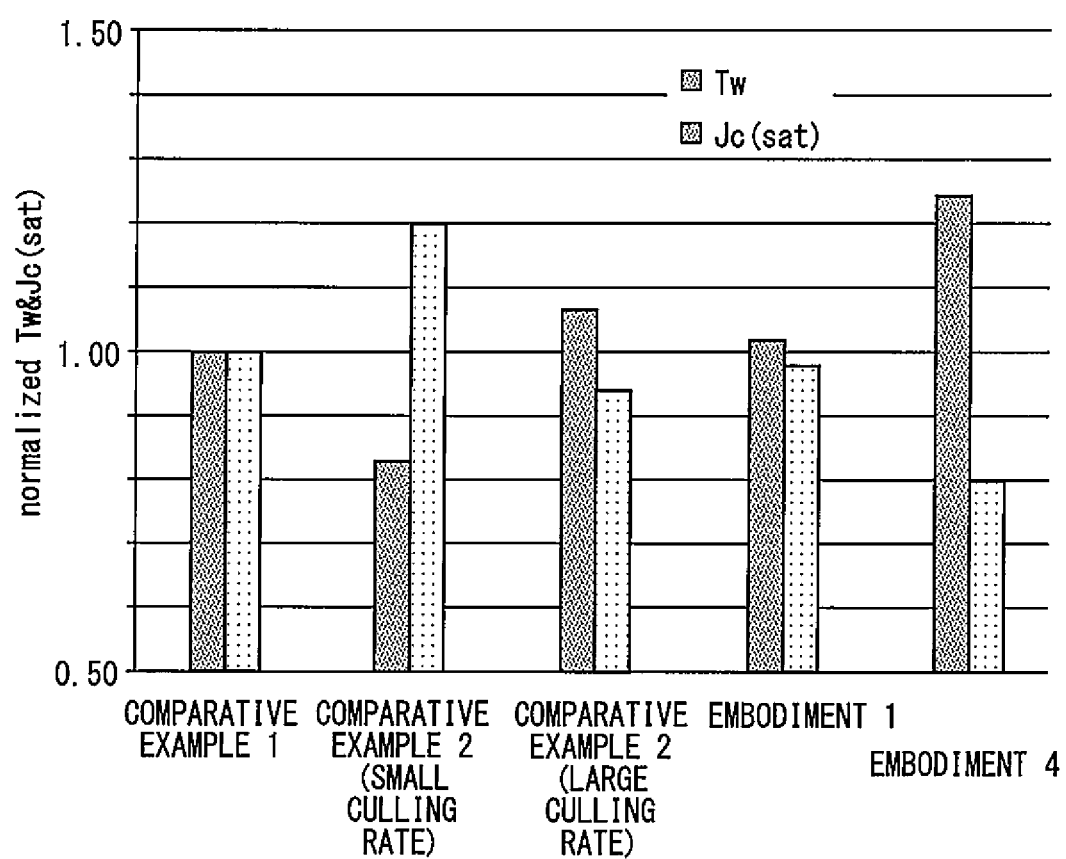
FIG. 23 is a view showing short-circuit breaking capacities Jc of the devices of Comparative Examples 1 and 2 and Embodiments 1 and 4.

FIG. 23 is a view showing short-circuit breaking capacities Jc of the devices of Comparative Examples 1 and 2 and Embodiments 1 and 4. Evaluation conditions are $V_{CC}$=4500 V, $V_{GE}$=15 V, and $T_j$=125° C. An indicator of short-circuit breaking capacity is a maximum pulse width TW capable of disconnection without breaking the device. Here, TW of Comparative Example 1 is defined as 1, and Jc(sat) of Comparative Example 1 is defined as 1. As Jc(sat) increases, heat generated in the device during short-circuiting increases, and short-circuit withstanding time (TW) decreases. It can be seen that in Embodiment 4, since Jc(sat) is reduced, a higher short-circuit breaking capacity is achieved.

Figure 24:
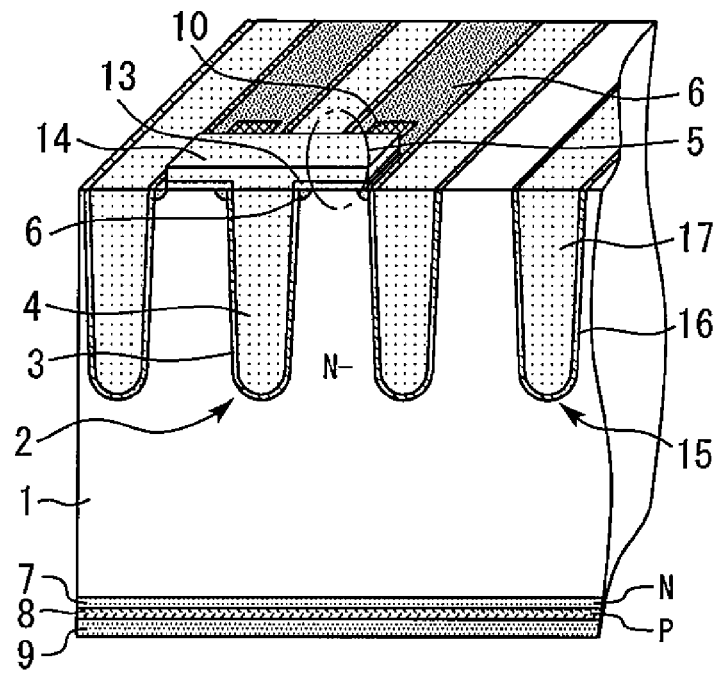
FIG. 24 is a perspective cross-sectional view showing a modified example of the semiconductor device according to Embodiment 4 of the present invention.

FIG. 24 is a perspective cross-sectional view showing a modified example of the semiconductor device according to Embodiment 4 of the present invention. One gate trench 4 is sandwiched between two mesa portions. In this case, again, the same effects as those of the above-described embodiment can be obtained.

[Embodiment 5]

Figure 25:
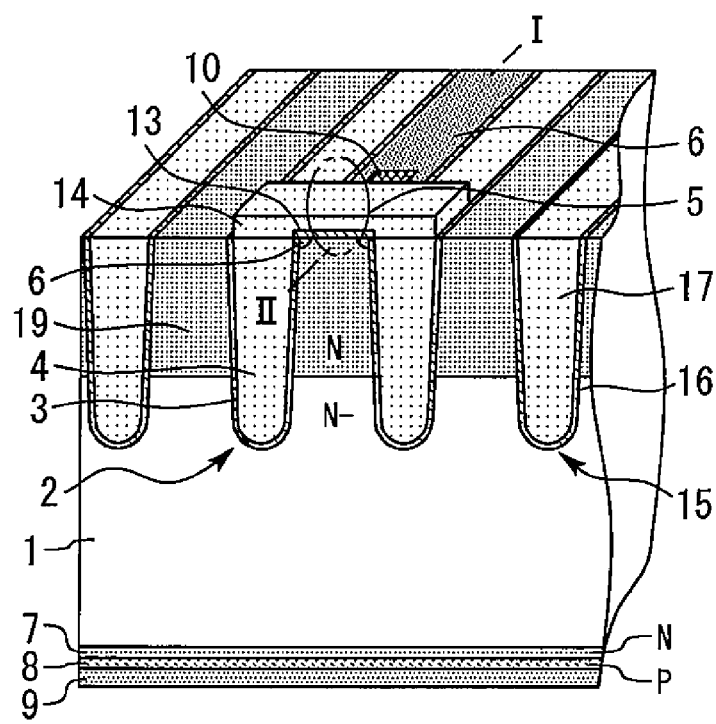
FIG. 25 is a perspective cross-sectional view showing a semiconductor device according to Embodiment 5 of the present invention.

FIG. 25 is a perspective cross-sectional view showing a semiconductor device according to Embodiment 5 of the present invention. A cross-sectional view taken along I-II of FIG. 25 is the same as that of FIG. 15. An N-type diffusion layer 19 serving as the drain of the planar MOSFET 5 is provided throughout the entire cell region. The N-type diffusion layer 19 has a higher impurity concentration than that of the N⁻-type semiconductor substrate 1, and is at a shallower depth than the trenches 2. The N-type diffusion layer 19 serves as a barrier layer against holes, and the carrier concentration on the emitter side of the device increases. Accordingly, the ON voltage can be reduced. Other components and effects are the same as those of Embodiment 4. Moreover, in Embodiment 5, the N-type diffusion layer 19 may be provided under part of the planar gate 14 as in Embodiment 3. In this case, again, the same effects as those of Embodiment 5 can be obtained.

It should be noted that the semiconductor device is not limited to being made of silicon, and may be made of a wide band gap semiconductor having a wider band gap than silicon. Examples of the wide band gap semiconductor are, for example, silicon carbide, gallium nitride-based materials, and diamond. A semiconductor device made of such a wide band gap semiconductor has a high breakdown voltage and a high allowable current density, and can therefore be miniaturized. By using the miniaturized device, a semiconductor module into which the device is incorporated can also be miniaturized. Further, since the heat resistance of the device is high, radiation fins of a heat sink can be miniaturized, and a water-cooled portion can be changed to an air-cooled portion. Accordingly, the semiconductor module can be further miniaturized. Moreover, by virtue of small power loss in the device and high efficiency thereof, the efficiency of the semiconductor module can be improved.

REFERENCE SIGNS LIST

1 N⁻-type semiconductor substrate; 2 trench; 3,16 insulating film; 4 gate trench; 5 planar MOSFET; 6 P⁺-type emitter layer; 8 P-type collector layer; 10 N⁺-type emitter layer; 12 P-type base layer; 13 gate insulating film; 14 planar gate; 15 dummy trench; 17 dummy gate trench; 19 N-type diffusion layer

The invention claimed is:
1. A semiconductor device comprising:
an N-type semiconductor substrate;
a plurality of trenches in an upper surface of the N-type semiconductor substrate;
a gate trench in the trench with an insulating film interposed therebetween;
a planar MOSFET on the upper surface of the N-type semiconductor substrate in a mesa portion between the trenches;
a P-type emitter layer between the trench and the planar MOSFET in a lateral direction of the trench in planar view perpendicular to the upper surface of the N-type semiconductor substrate in the mesa portion; and
a P-type collector layer on a lower surface of the N-type semiconductor substrate,
wherein the planar MOSFET includes an N-type emitter layer, an upper portion of the N-type semiconductor substrate, a P-type base layer between the N-type emitter layer and the upper portion of the N-type semiconductor substrate, and a planar gate on a part of the N-type emitter layer, the upper portion of the N-type semiconductor substrate and the P-type base layer with a gate insulating film interposed therebetween,
the planar gate is connected to the gate trench,
the P-type emitter layer has a higher impurity concentration than the P-type base layer and has an electric potential equal to an emitter potential of the N-type emitter layer,
the P-type emitter layer is provided between the N-type emitter layer and the trench and between the P-type base layer and the trench,
the N-type emitter layer and the P-type base layer are not in contact with the insulating film in the trench, and
a trench MOSFET is not formed.

2. The semiconductor device of claim 1, wherein the N-type emitter layer, the P-type base layer, and the upper portion of the N-type semiconductor substrate are arranged in order in a longitudinal direction of the trench in the planar view.

3. The semiconductor device of claim 2, wherein a width of the P-type base layer in a lateral direction of the trench in the planar view is not less than 0.3 μm.

4. The semiconductor device of claim 2, wherein a distance between the P-type base layer and an adjacent P-type base layer in a longitudinal direction of the trench in the planar view is not less than 3.0 μm.

5. The semiconductor device of claim 1, further comprising an N-type diffusion layer in the upper portion of the N-type semiconductor substrate and having a higher impurity concentration than the N-type semiconductor substrate, and having a shallower depth than the trench.

6. The semiconductor device of claim 1, further comprising:
a plurality of dummy trenches in the upper surface of the N-type semiconductor substrate; and
a dummy gate trench in the dummy trench with an insulating film interposed therebetween and having an electric potential equal to the emitter potential of the N-type emitter layer.

* * * * *